United States Patent
Liu et al.

(10) Patent No.: US 9,219,494 B2
(45) Date of Patent: Dec. 22, 2015

(54) DUAL MODE ANALOG TO DIGITAL CONVERTER

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Hsiang-Wei Liu, New Taipei (TW); Ting-Hao Wang, Keelung (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/516,591

(22) Filed: Oct. 17, 2014

(65) Prior Publication Data

US 2015/0109159 A1    Apr. 23, 2015

(30) Foreign Application Priority Data

Oct. 17, 2013   (TW) .............................. 102137527 A (51) Int. Cl.
*H03M 3/00* (2006.01)
*H03M 1/00* (2006.01)
*H03M 1/46* (2006.01)

(52) U.S. Cl.
CPC .............. *H03M 3/398* (2013.01); *H03M 1/005* (2013.01); *H03M 1/466* (2013.01)

(58) Field of Classification Search
CPC ........ H03M 1/46; H03M 1/002; H03M 1/466
USPC .................................. 341/155, 163, 143, 144
See application file for complete search history.

(56) References Cited

U.S. PATENT DOCUMENTS

| | | | |
|---|---|---|---|
| 7,504,977 B2* | 3/2009 | Doorenbos et al. | 341/143 |
| 7,916,061 B2 | 3/2011 | Chae et al. | |
| 7,944,386 B2* | 5/2011 | Hurrell et al. | 341/155 |
| 8,102,292 B1* | 1/2012 | Van Ess | 341/143 |
| 8,232,905 B2* | 7/2012 | Steensgaard-Madsen | 341/155 |

* cited by examiner

*Primary Examiner* — Peguy Jean Pierre
(74) *Attorney, Agent, or Firm* — CKC & Partners Co., Ltd.

(57) ABSTRACT

An analog to digital converter is disclosed herein. The analog to digital converter includes a bit conversion module and a control module. The bit conversion module is configured to generate a quantization output in accordance with an input signal. The control module is configured to control the bit conversion module, so as to make the bit conversion module operate in one of a sigma delta mode and a successive approximation mode.

18 Claims, 6 Drawing Sheets

DUAL MODE ANALOG TO DIGITAL CONVERTER

RELATED APPLICATIONS

This application claims priority to Taiwan Application Serial Number 102137527, filed Oct. 17, 2013, which is herein incorporated by reference.

BACKGROUND

1. Technical Field

The present disclosure relates to an analog to digital converter. More particularly, the present disclosure relates to a dual-mode analog to digital converter.

2. Description of Related Art

Analog to digital converters are commonly used in a variety of electronic products, such as signal input interfaces of displays, sound cards, etc. With different applications of analog to digital converters in various products, parameters such as resolution, operating frequency, dynamic range, etc. of the analog to digital converters usually determine performance of the products.

Different types of analog-to-digital conversion technologies have been rapidly developed in recent years. One common analog to digital converter is developed based on sigma delta modulation technology. In this type of analog to digital converter, noise shaping and over-sampling technologies are employed to allow the analog to digital converter to have a high resolution. Thus, the analog to digital converters based on the technology using a sigma delta modulator are frequently applied to biomedicine or processing of high order images/voices.

Another common analog to digital converter is a successive approximation analog to digital converter. This type of analog to digital converter redistributes the capacitive charges repeatedly so as to generate the digit code correspondingly. However, owing to the impact of process variation, mismatches among capacitors usually occur in successive approximation analog to digital converters so that resolutions of this kind of analog to digital converter are not easily increased.

Generally speaking, the above-mentioned two types of analog to digital converters are implemented with different circuit architectures, and the different circuit architectures are required depending on the service condition in advance and are not allowed to be changed based on different input signals flexibly. For example, when the frequency of the input signal is low, a sigma delta analog to digital converter may be utilized to improve the overall resolution. When the overall power consumption and rate are considered, a successive approximation analog to digital converter may be utilized.

SUMMARY

One aspect of the present disclosure is to provide an analog to digital converter. The analog to digital converter includes a bit conversion module and a control module. The bit conversion module is configured to generate a quantization output in accordance with a first input signal and a second input signal. The control module is configured to control the bit conversion module, so as to make the bit conversion module operates in one of a sigma delta mode and a successive approximation mode.

Another aspect of the present disclosure is to provide an analog to digital converter. The analog to digital converter includes a bit conversion module and a control module. The bit conversion module is configured to generate a quantization output. The bit conversion module includes an amplifier, a first reset switch, and a second reset switch. The control module is configured to control the first reset switch and the second reset switch, so as to make the bit conversion module operates in one of a sigma delta mode and a successive approximation mode. The first reset switch and the second reset switch are turned off in accordance with a configuration of the control module when the bit conversion module operates in the sigma delta mode, and the first reset switch and the second reset switch are selectively turned on based on a first clock signal in accordance with the configuration of the control module when the bit conversion module operates in the successive approximation mode, so as to discharge residual charges on the amplifier.

In summary, the technical solution of the present disclosure has obvious advantages and beneficial effects as compared to the prior art. Through the above technical solution, considerable advances in technology and extensive industrial applicability can be achieved. The analog to digital converter in the present disclosure achieves the operations of both the sigma delta analog to digital converter and the successive approximation analog to digital converter through a single circuit structure.

It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Reference will now be made in detail to the present embodiments of the present disclosure, examples of which are illustrated in the accompanying drawings. However, the embodiments provided herein are intended as illustrative only since numerous modifications and variations therein will be apparent to those skilled in the art. Description of the operation does not intend to limit the operation sequence. Any devices resulting from recombination of components with equivalent effects are within the scope of the present disclosure. In addition, drawings are only for the purpose of illustration and not plotted according to the original size. Wherever possible, the same reference numbers are used in the drawings and the description to refer to the same or like parts.

As used herein, "the first", "the second", . . . etc. do not refer to the order or priority, nor are they intended to limit the invention. They are merely used to distinguish the devices or operations described with the same technical terms.

In this document, the term "coupled" may also be termed as "electrically coupled", and the term "connected" may be termed as "electrically connected". "Coupled" and "connected" may also be used to indicate that two or more elements cooperate or interact with each other.

Figure 1:
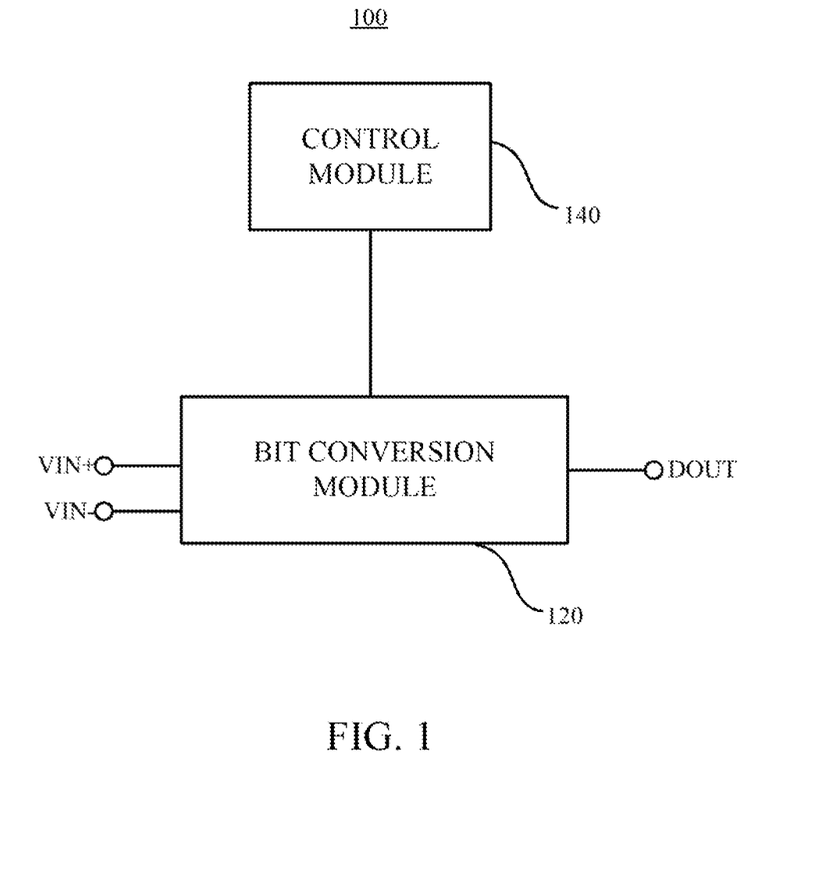
FIG. 1 is a schematic diagram of an analog to digital converter according to one embodiment of the present disclosure.

Reference is made to FIG. 1. FIG. 1 is a schematic diagram of an analog to digital converter 100 according to one embodiment of the present disclosure. As shown in FIG. 1, the analog to digital converter 100 includes a bit conversion module 120 and a control module 140. The bit conversion module 120 has a positive input terminal and a negative input terminal. The positive input terminal is configured to receive a first input signal VIN+. The negative input terminal is configured to receive a second input signal VIN−. The bit conversion module 120 generates a quantization output DOUT in accordance with the first input signal VIN+ and the second input signal VIN−. The control module 140 is configured to control the bit conversion module 120, so as to make the bit conversion module 120 operate in one of a sigma delta mode and a successive approximation mode. The control module 140 may be implemented in a digital control circuit, an external chip, or software control.

A number of embodiments are shown as follows by way of illustration. However, it should be understood that such description is only for explanation of functions and operations of the above analog to digital converter 100 and not to limit the scope of the present disclosure.

Figure 2:
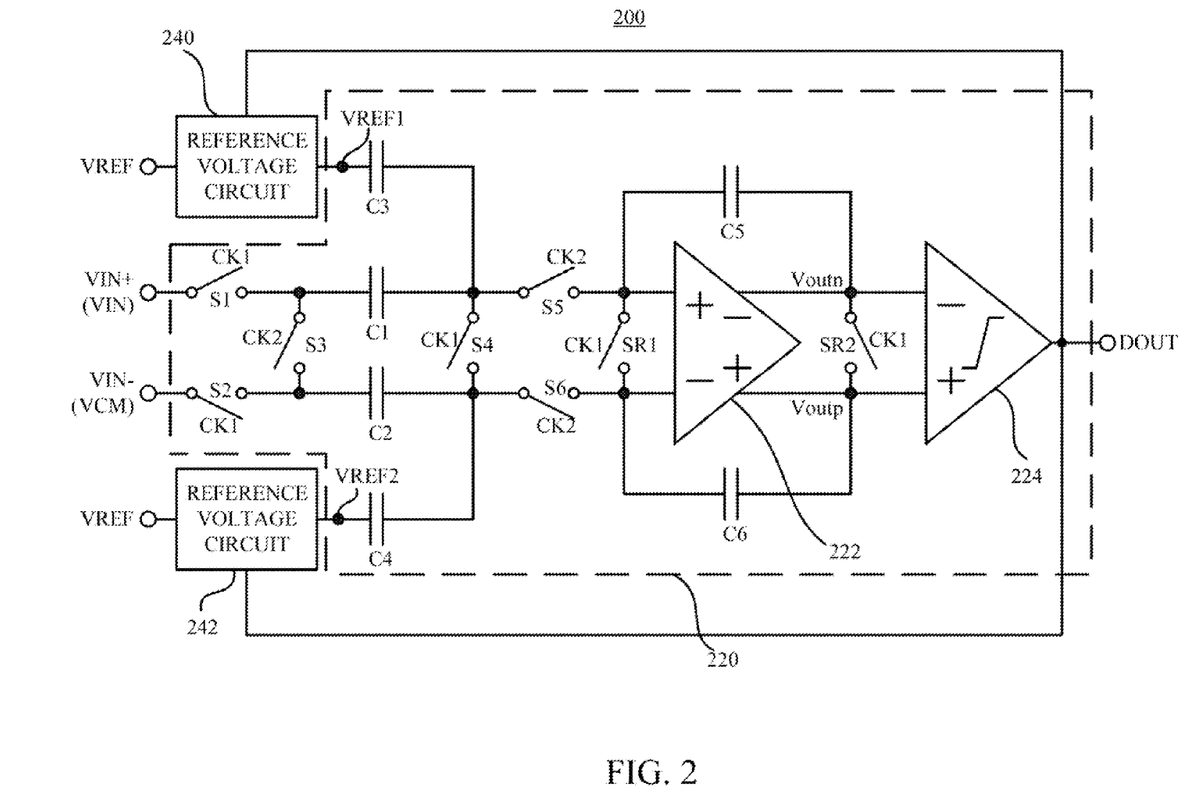
FIG. 2 is a schematic diagram of a bit conversion module 200 according to one embodiment of the present disclosure.

Reference is made to FIG. 2. FIG. 2 is a schematic diagram of a bit conversion module 200 according to one embodiment of the present disclosure. As shown in FIG. 2, the bit conversion module 200 includes a switching circuit 220, a voltage reference circuit 240, and a voltage reference circuit 242. The switching circuit 220 includes an amplifier 222, a reset switch SR1, a reset switch SR2, and a comparator 224. A first terminal of the reset switch SR1 is electrically coupled to a positive input terminal of the amplifier 222. A second terminal of the reset switch SR1 is electrically coupled to a negative input terminal of the amplifier 222. A first terminal of the reset switch SR2 is electrically coupled to a negative output terminal Voutn of the amplifier 222. A second terminal of the reset switch SR2 is electrically coupled to a positive output terminal Voutp of the amplifier 222. When the bit conversion module 200 operates in the sigma delta mode, the reset switch SR1 and the reset switch SR2 are turned off in accordance with a configuration of the control module 140. When the bit conversion module 200 operates in the successive approximation mode, the reset switch SR1 and the reset switch SR2 are selectively turned on based on a clock signal CK1 in accordance with the configuration of the control module 140. The comparator 224 is configured to generate the above-mentioned quantization output DOUT. The voltage reference circuit 240 is configured to generate a reference voltage VREF1 based on an external reference voltage VREF and the quantization output DOUT. The voltage reference circuit 242 is configured to generate a reference voltage VREF2 based on the external reference voltage VREF and the quantization output DOUT. For illustration, the voltage reference circuit 240 and the voltage reference circuit 242 may be various types of digital to analog converters (DACs), such as a capacitor array DAC, a resistor array DAC, a weighted current source DAC, a current cell matrix DAC, etc.

In addition, as shown in FIG. 2, the switching circuit 220 may include switches S1, S2, S3, S4, S5, S6 and capacitors C1, C2, C3, C4, C5, C6. In view of the structure, among the switches, a first terminal of the switch S1 is configured to receive the first input signal. VIN+, and a control terminal of the switch S1 is configured to receive the clock signal CK1. A first terminal of the switch S2 is configured to receive the second input signal VIN−, and a control terminal of the switch S2 is also configured to receive the clock signal CK1. A first terminal of the switch S3 is electrically coupled to a second terminal of the switch S1. A second terminal of the switch S3 is electrically coupled to a second terminal of the switch S2. A control terminal of the switch S3 is configured to receive a clock signal CK2. A first terminal of the switch S4 is electrically coupled to the first terminal of the switch S3 via the capacitor C1, a second terminal of the switch S4 is electrically coupled to the second terminal of the switch S3 via the capacitor C2, and a control terminal of the switch S4 is configured to receive the clock signal CK1. A first terminal of the switch S5 is electrically coupled to the first terminal of the switch S4, a second terminal of the switch S5 is electrically coupled to the first terminal of the reset switch SR1, and a control terminal of the switch S5 is configured to receive the clock signal CK2. A first terminal of the switch S6 is electrically coupled to the second terminal of the switch S4, a second terminal of the switch S6 is electrically coupled to the second terminal of the reset switch SR1, and a control terminal of the switch S6 is configured to receive the clock signal CK2.

Furthermore, one terminal of the capacitor C1 is electrically coupled to the first terminal of the above switch S3, and another terminal of the capacitor C1 is electrically coupled to the first terminal of the switch S4. One terminal of the capacitor C2 is electrically coupled to the second terminal of the switch S3, and another terminal of the capacitor C2 is electrically coupled to the second terminal of the switch S4. One terminal of the capacitor C3 is configured to receive the reference voltage VREF1, another terminal of the capacitor C3 is electrically coupled to the first terminal of the switch S4. One terminal of the capacitor C4 is configured to receive the reference voltage VREF2, another terminal of the capacitor C4 is electrically coupled to the second terminal of the switch S4. One terminal of the capacitor C5 is electrically coupled to the positive input terminal of the amplifier 222, and another terminal of the capacitor C5 is electrically coupled to the negative output terminal Voutn of the amplifier 222. One terminal of the capacitor C6 is electrically coupled to the negative input terminal of the amplifier 222, and another terminal of the capacitor C6 is electrically coupled to the positive output terminal Voutp of the amplifier 222.

In view of operation, the switch S1, the switch S2, and the switch S4 are configured to be selectively turned on based on the clock signal CK1. The switch S3, the switch S5, and the switch S6 are configured to be selectively turned on based on the clock signal CK2. A phase of the clock signal CK1 and a phase of the clock signal CK2 are non-overlapped. Specifically, the capacitor C1 samples the first input signal VIN+ when the switches S1, S4 are turned on and the switches S3, S5 are turned off, so as to store a value of the current first input signal VIN+. Similarly, the capacitor C2 samples the second input signal VIN− when the switches S2, S4 are turned on and the switches S5, S6 are turned off, so as to store a value of the second input signal VIN−. The capacitor C3 and the capacitor C4 respectively sample the reference voltage VREF1 and the reference voltage VREF2 when the switch S4 is turned on and the switches S5, S6 are turned off, so as to store values of the reference voltage VREF1 and the reference voltage VREF2.

Figure 3A:
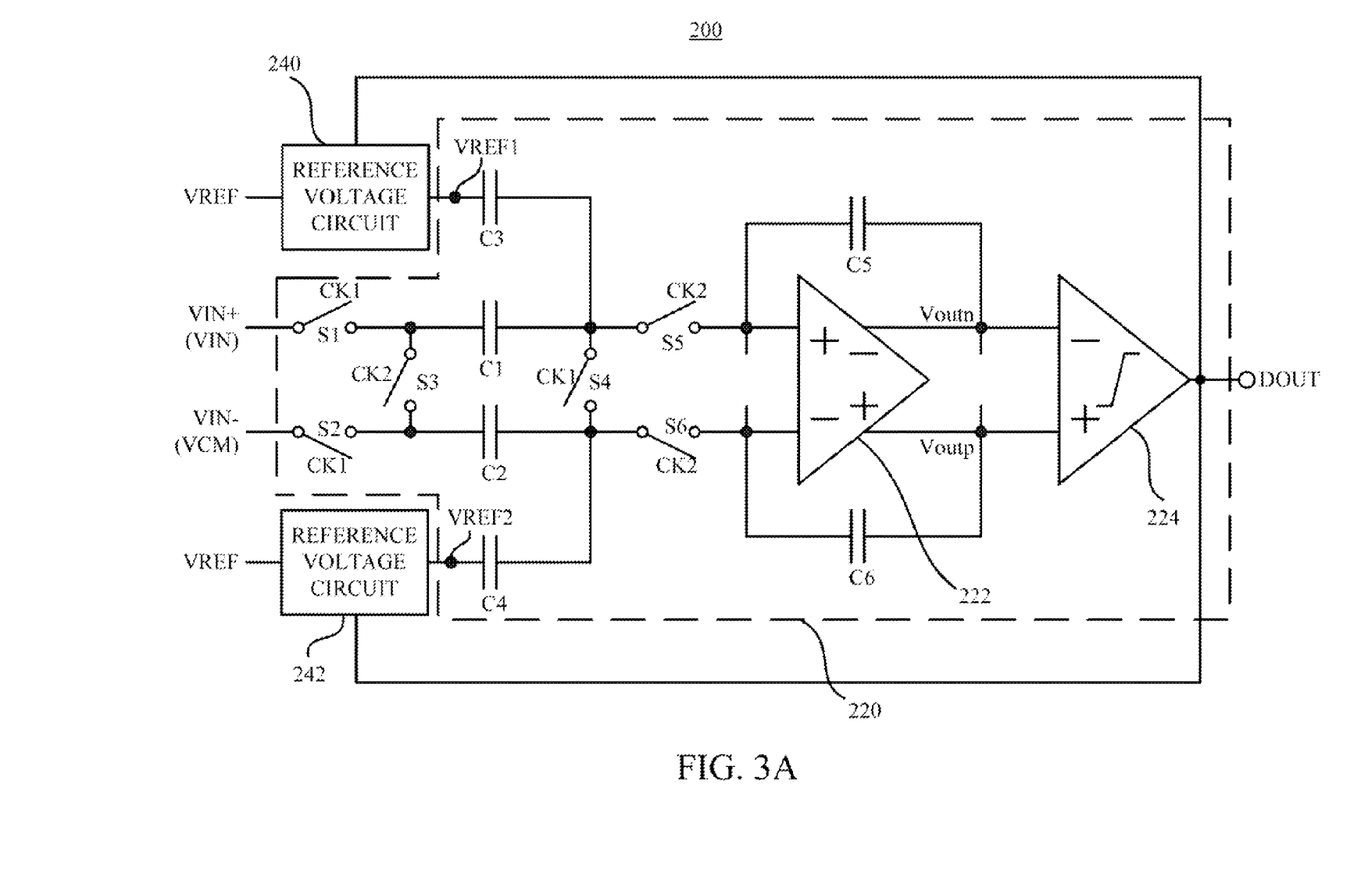
FIG. 3A is a schematic diagram of the bit conversion module in FIG. 2 operating in a sigma delta mode according to one embodiment of the present disclosure.
Figure 3B:
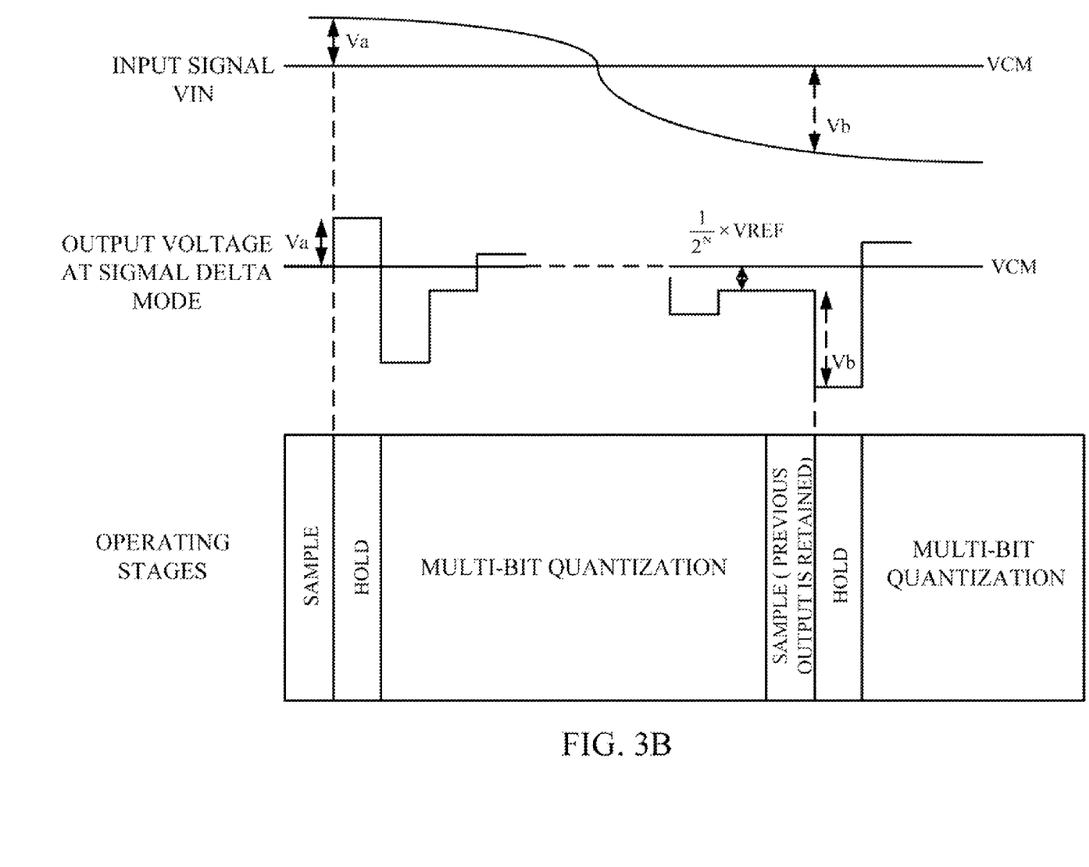
FIG. 3B is a waveform diagram of schematic and operating stages of the bit conversion module 200 operating in a sigma delta mode according to one embodiment of the present disclosure.

Reference is made to both of FIG. 3A and FIG. 3B. FIG. 3A is a schematic diagram of the bit conversion module 200 in FIG. 2 operating in a sigma delta mode according to one embodiment of the present disclosure. FIG. 3B is a waveform diagram of schematic and operating stages of the bit conversion module 200 operating in a sigma delta mode according to one embodiment of the present disclosure. In the following embodiment, a single-ended input operation of the bit conversion module 200 is provided. That is, the first input signal VIN+ is set as an input signal VIN, and the second input signal VIN− is set as a common mode voltage VCM. As shown in FIG. 3A, when the bit conversion module 200 operates in the sigma delta mode, the reset switch SR1 and the reset switch SR2 are turned off in accordance with the configuration of the control module 140. At this time, the bit conversion module 200 may be regarded as a first-order sigma delta modulator equivalently. A complete conversion cycle is able to be divided into a sampling stage, a holding stage, and a quantization stage. As shown in FIG. 3B, during the sampling stage, the bit conversion module 200 samples the input signal VIN. At this time, the switch S1 is turned on to store the input signal VIN in the capacitor C1 (i.e., amplitude Va) and the switch S2 is turned on to store the common mode voltage VCM in the capacitor C2. At this time, the switch S4 is turned on and the switches S3, S5, S6 are turned off. During the holding stage, when the switches S1, S2, S4 are turned off and the switch S3 is turned on. The switch S5 is turned on to transfer charges stored in the capacitor C1 and the capacitor C3 to the capacitor C5. The switch S6 is turned on to transfer charges stored in the capacitor C2 and the capacitor C4 to the capacitor C6. The charges stored in the capacitor C1 and the capacitor C2 are respectively transferred to the capacitor C5 and the capacitor C6 through the amplifier 222, and such operations are performed to integrate the charges stored in the capacitor C1 and the capacitor C2.

At this time, if each of the capacitors has the same capacitance, a voltage at the negative output terminal Voutn of the amplifier 222 is equivalent to $-Va+\frac{1}{2} \times VREF$, and a voltage at the positive output terminal Voutp of the amplifier 222 is equivalent to $\frac{1}{2} \times VREF$. If Va is higher than $\frac{1}{2} \times VREF$, the comparator 224 will generate an initial quantization output as 1. Conversely, if Va is lower than $\frac{1}{2} \times VREF$, the comparator 224 will generate the initial quantization output DOUT as 0. During the quantization stage, the voltage reference circuit 240 and the voltage reference circuit 242 will change the reference voltage VREF1 and the reference voltage VREF2 based on the initial quantization output DOUT, sample the reference voltage VREF1 and the reference voltage VREF2 through the capacitor C3 and the capacitor C4, and the above-mentioned operation of the comparator 224 is repeated. In other words, the bit conversion module 200 equivalently computes the multi-bit quantization outputs DOUT during the quantization stage after performing quantization operations in multiple clock cycles.

In addition, since a sigma delta modulator performs continuous-time integration operations, the bit conversion module 200 retains the residual voltage obtained from the previous operation and continues to perform the next operation while retaining the residual voltage during the next sampling stage. For illustration, as shown in FIG. 3B, the residual output voltage of the bit conversion module 200 is $(\frac{1}{2}^N) \times VREF$ after the first conversion is completed, where N is a number of bits of the bit conversion module 200. During the next sampling stage, if the sampled input signal VIN has an amplitude of Vb, the bit conversion module 200 accumulates $(\frac{1}{2}^N) \times VREF$ and Vb to perform the next continuous-time integration operation continuously.

Figure 4:
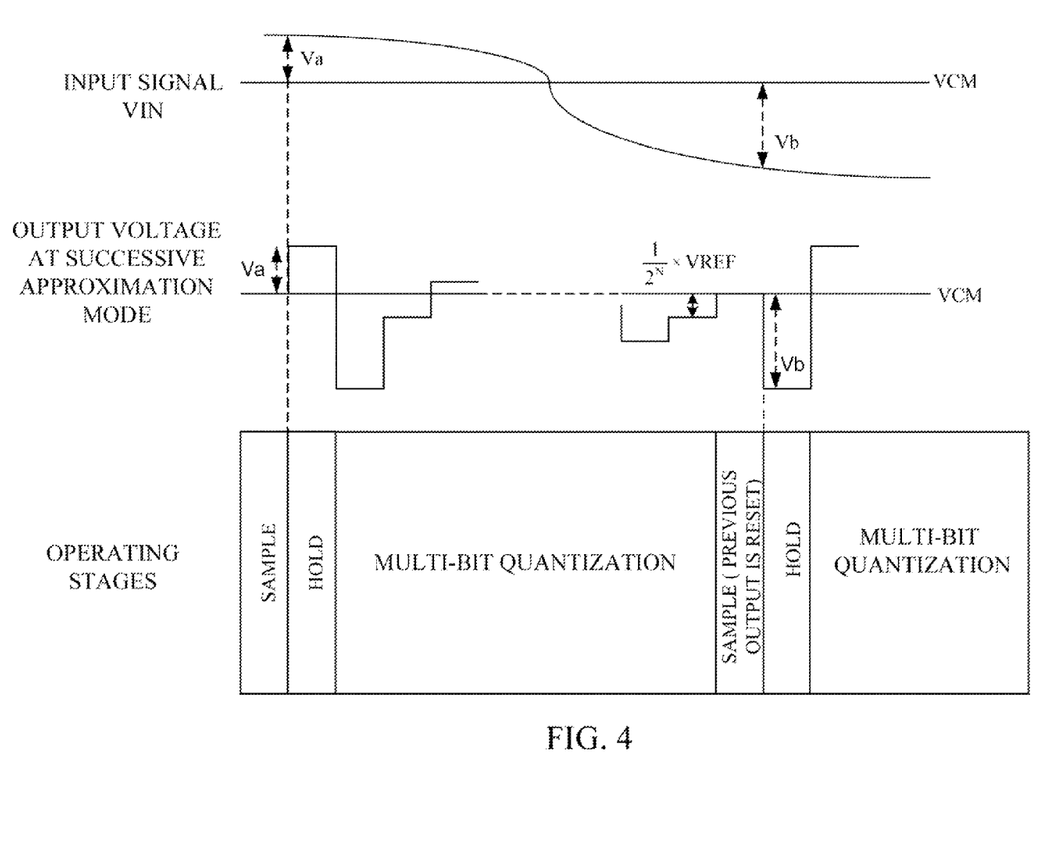
FIG. 4 is a waveform diagram of schematic and operating stages of the bit conversion module 200 operating in a successive approximation mode according to one embodiment of the present disclosure.

Reference is made to FIG. 4. FIG. 4 is a waveform diagram of schematic and operating stages of the bit conversion module 200 operating in a successive approximation mode according to one embodiment of the present disclosure. Similarly, the bit conversion module 200 works in the single-ended input operation according to the present embodiment. As shown in FIG. 4, when the above-mentioned bit conversion module 200 operates in the successive approximation mode, the control module 140 is configured to selectively turn on the reset switch SR1 and the reset switch SR2 based on the clock signal CK1. In this manner, residual charges at the input terminals and the output terminals of the amplifier 222 are discharged each time before the quantization of the input signal VIN is performed.

Similarly, a complete conversion cycle is also divided into a sampling stage, a holding stage, and a quantization stage when the bit conversion module 200 operates in the successive approximation mode. For illustration, as shown in FIG. 4, the bit conversion module 200 samples the input signal VIN during the sampling stage. At this time, the switch S1 is turned on to store the input signal VIN in the capacitor C1 (i.e., the amplitude Va) and the switch S2 is turned on to store the common mode voltage VCM in the capacitor C2. The reset switch SR1 and the reset switch SR2 are also turned on to discharge the residual charges on the amplifier 222. During the holding stage, the switches S1, S2, S4 are turned off and the switch S3 is turned on. The switch S5 is turned on to transfer the charges stored in the capacitor C1 and the capacitor C3 to the capacitor C5 and the switch Se is turned on to transfer the charges stored in the capacitor C2 and the capacitor C4 to the capacitor C6. At this time, if each of the capacitors has the same capacitance, the voltage at the negative output terminal Voutn of the amplifier 222 is equivalent to $-Va+\frac{1}{2} VREF$, and the voltage at the positive output terminal Voutp of the amplifier 222 is equivalent to $\frac{1}{2} \times VREF$. If Va is higher than $\frac{1}{2} \times VREF$, the comparator 224 generates the initial quantization output as 1. Conversely, if Va is lower than $\frac{1}{2} \times VREF$, the comparator 224 generates the initial quantization output as 0. During the quantization stage, the voltage reference circuit 240 and the voltage reference circuit 242 changes the reference voltage VREF1 and the reference voltage VREF2 based on the initial quantization output to sequentially adjust them to $\frac{1}{2}^2 \times VREF$, $\frac{1}{2}^3 \times VREF$ $\frac{1}{2}^N \times VREF$, where N is the number of bits of the bit conversion module 200. The above-mentioned operation of the comparator 224 is repeated to generate the multi-bit quantization outputs DOUT correspondingly.

Additionally, the successive approximation bit conversion module 200 computes the quantization outputs DOUT corresponding to the sampled input signals VIN by using a binary method to calculate sequentially. Hence, in each sampling, the residual voltage accumulated in the previous operation must be reset to zero, so that the correct quantization output DOUT can be obtained during the next conversion. As shown in FIG. 4, after the first conversion is completed, the residual output voltage of the bit conversion module 200 is $(\frac{1}{2}^N) \times VREF$. When entering into the next sampling stage (that is to sample Vb) the bit conversion module 200 discharges the residual output voltage by turning on the reset switch SR1 and the reset switch SR2.

Figure 5:
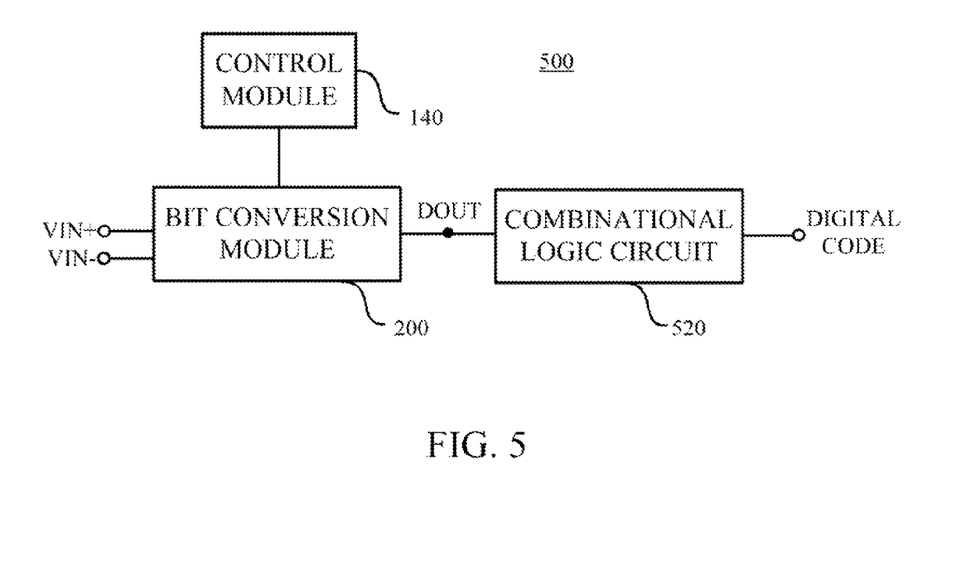
FIG. 5 is a schematic diagram of an analog to digital converter 500 according to one embodiment of the present disclosure.

Reference is made to FIG. 5. FIG. 5 is a schematic diagram of an analog to digital converter 500 according to one embodiment of the present disclosure. The analog to digital converter 500 may further include a combinational logic circuit 520. The combinational logic circuit 520 is configured to encode the multi-bit quantization outputs DOUT generated in each of the conversions by the bit conversion module 200, so as to generate a corresponding digital code, which is provided to a digital circuit of the system for subsequent signal applications. The combinational logic circuit 520 may include combinations of digital circuits, such as a register, a counter, an adder, etc. Those of ordinary skill in the art may flexibly design the combinational logic circuit 520 as required by the practical needs of encoding and decoding, and the present disclosure is not limited in this regard.

In the above embodiments, the analog to digital converter 100 in the present disclosure is applied to the single-ended input operation, however, the analog to digital converter 100 in the present disclosure may also be applied a fully differential operation. Those of ordinary skill in the art may selectively dispose the analog to digital converter 100 for the single-ended input operation or the fully differential operation as required.

For illustration, when working in the fully differential operation, a phase of the first input signal VIN+ and a phase of the second input signal VIN− are set to be opposite, and an amplitude of the first input signal VIN+ is the same as an amplitude of the second input signal VIN−. In one embodiment, when the above-mentioned bit conversion module 200 operates in the sigma delta mode, the output voltage originally shown in FIG. 3B may be two times of Va. In other words, when working in the fully differential operation, the bit conversion module 200 is configured for integrating a difference between the first input signal VIN− and the second input signal VIN− so as to generate multi-bit quantization outputs DOUT correspondingly.

Similarly, in another embodiment, when the above-mentioned bit conversion module 200 operates in the successive approximation mode, the output voltage originally shown in FIG. 4 may be two times Va. That is, when working in the fully differential operation, the bit conversion module 200 generate quantization outputs DOUT by sequentially computing the difference between the sampled first input signal VIN+ and the sampled second input signal VIN− with the binary method. Since the single-ended input operation and the differential input operation substantially work in the same manner, a detail description in this regard is not provided.

In addition, according to the previous embodiments, no matter the bit conversion module 200 operates in the sigma delta mode or the successive approximation mode, operation frequencies of the clock signal CK1 and the clock signal CK2 may be the same or different from each other. Those of ordinary skill in the art may perform adjustment flexibly as required by specifications in practical applications.

In summary, the analog to digital converter in the present disclosure achieves the operations of both the sigma delta analog to digital converter and the successive approximation analog to digital converter through a single circuit structure. When compared with the analog to digital converter used in some approaches in which a single circuit only realizes one mode, the analog to digital converter in the present disclosure has the advantages of relative low cost and extensive applicability.

Although the present disclosure has been described in considerable detail with reference to certain embodiments thereof, other embodiments are possible. Therefore, the spirit and scope of the appended claims should not be limited to the description of the embodiments contained herein.

It be apparent to those sidled in the art that various modifications and variations can be made to the structure of the present disclosure without departing from the scope or spirit of the present disclosure. In view of the foregoing, it is intended that the present disclosure cover modifications and variations of this invention provided they fall within the scope of the following claims and their equivalents.

What is claimed is:

1. An analog to digital converter comprising:
a bit conversion module configured to generate a quantization output in accordance with a first input signal and a second input signal; and
a control module configured to control the bit conversion module, so as to make the bit conversion module operate in one of a sigma delta mode and a successive approximation mode;
wherein the bit conversion module comprises a switching circuit, the switching circuit comprises:
an amplifier comprising two input terminals and two output terminals;
a first reset switch electrically coupled between the two input terminals of the amplifier; and
a second reset switch electrically coupled between the two output terminals of the amplifier;
wherein the first reset switch and the second reset switch are turned off in accordance with a configuration of the control module when the bit conversion module operates in the sigma delta mode, and the first reset switch and the second reset switch are selectively turned on based on a first clock signal in accordance with the configuration of the control module when the bit conversion module operates in the successive approximation mode.

2. The analog to digital converter of claim 1, wherein the switching circuit comprises:
a first switch configured to receive the first input signal and being selectively turned on based on the first clock signal;
a second switch configured to receive the second input signal and being selectively turned on based on the first clock signal;
a third switch electrically coupled between the first switch and the second switch and configured to be selectively turned on based on a second clock signal;
a first capacitor electrically coupled to the first switch and configured to store the first input signal;
a second capacitor electrically coupled to the second switch and configured to store the second input signal;
a fourth switch electrically coupled between the first capacitor and the second capacitor and configured to be selectively turned on based on the first clock signal;
a third capacitor electrically coupled to the fourth switch and configured to store a first reference voltage;
a fourth capacitor electrically coupled to the fourth switch and configured to store a second reference voltage;
a fifth switch electrically coupled between one of the two input terminals of the amplifier and the third capacitor and configured to be selectively turned on based on the second clock signal;
a sixth switch electrically coupled between another one of the two input terminals of the amplifier and the fourth capacitor and configured to be selectively turned on based on the second clock signal;
a fifth capacitor electrically coupled between the one of the two input terminals of the amplifier and one of the two output terminals of the amplifier;
a sixth capacitor electrically coupled between the another one of the two input terminals of the amplifier and another one of the two output terminals of the amplifier; and a comparator electrically coupled to the amplifier and configured to generate the quantization output.

3. The analog to digital converter of claim 2, wherein the bit conversion module further comprises:
a first voltage reference circuit configured to generate the first reference voltage based on an external reference voltage and the quantization output; and
a second voltage reference circuit configured to generate the second reference voltage based on the external reference voltage and the quantization output.

4. The analog to digital converter of claim 3, wherein each of the first voltage reference circuit and the second voltage reference circuit is a digital to analog converter.

5. The analog to digital converter of claim 1, further comprising:
a combinational logic circuit configured to generate a digital code based on the quantization output.

6. The analog to digital converter of claim 2, further comprising:
a combinational logic circuit configured to generate a digital code based on the quantization output.

7. The analog to digital converter of claim 3, further comprising:
a combinational logic circuit configured to generate a digital code based on the quantization output.

8. The analog to digital converter of claim 4, further comprising:
a combinational logic circuit configured to generate a digital code based on the quantization output.

9. An analog to digital converter comprising:
a bit conversion module configured to generate a quantization output, the bit conversion module comprising an amplifier, a first reset switch, and a second reset switch; and
a control module configured to control the first reset switch and the second reset switch, so as to make the bit conversion module operate in one of a sigma delta mode and a successive approximation mode;
wherein the first reset switch and the second reset switch are turned off in accordance with a configuration of the control module when the bit conversion module operates in the sigma delta mode, and the first reset switch and the second reset switch are selectively turned on based on a first clock signal in accordance with the configuration of the control module when the bit conversion module operates in the successive approximation mode, so as to discharge residual charges on the amplifier.

10. The analog to digital converter of claim 9, wherein the bit conversion module has a positive input terminal and a negative input terminal, and the bit conversion module further comprises:
a first switch comprising a first terminal, a second terminal, and a control terminal, the first terminal being electrically coupled to the positive input terminal, and the control terminal being configured to receive the first clock signal;
a second switch comprising a first terminal, a second terminal, and a control terminal, the first terminal of the second switch being electrically coupled to the negative input terminal, and the control terminal of the second switch being configured to receive the first dock signal;
a third switch comprising a first terminal, a second terminal, and a control terminal, the first terminal of the third switch being electrically coupled to the second terminal of the first switch, the second terminal of the third switch being electrically coupled to the second terminal of the second switch, and the control terminal of the third switch being configured to receive a second clock signal;
a fourth switch comprising a first terminal, a second terminal, and a control terminal, the first terminal of the fourth switch being electrically coupled to the first terminal of the third switch, the second terminal of the fourth switch being electrically coupled to the second terminal of the third switch, and the control terminal of the fourth switch being configured to receive the first clock signal;
a fifth switch comprising a first terminal, a second terminal, and a control terminal, the first terminal of the fifth switch being electrically coupled to the first terminal of the fourth switch, the second terminal of the fifth switch being electrically coupled to one of two input terminals of the amplifier, and the control terminal of the fifth switch being configured to receive the second clock signal; and
a sixth switch comprising a first terminal, a second terminal, and a control terminal, the first terminal of the sixth switch being electrically coupled to the second terminal of the fourth switch, the second terminal of the sixth switch being electrically coupled to another one of the two input terminals of the amplifier, and the control terminal of the sixth switch being configured to receive the second clock signal.

11. The analog to digital converter of claim 10, wherein the bit conversion module further comprises:
a first capacitor, a first terminal of the first capacitor being electrically coupled to the first terminal of third switch, a second terminal of the first capacitor being electrically coupled to the first terminal of the fourth switch;
a second capacitor, a first terminal of the second capacitor being electrically coupled to the second terminal of third switch, a second terminal of the second capacitor being electrically coupled to the second terminal of the fourth switch;
a third capacitor, a first terminal of the third capacitor being configured to receive a first reference voltage, a second terminal of the third capacitor being electrically coupled to the first terminal of the fourth switch;
a fourth capacitor, a first terminal of the fourth capacitor being configured to receive a second reference voltage, a second terminal of the fourth capacitor being electrically coupled to the second terminal of the fourth switch;
a fifth capacitor, a first terminal of the fifth capacitor being electrically coupled to the one of the two input terminals of the amplifier, and a second terminal of the fifth capacitor being electrically coupled to one of two output terminals of the amplifier; and
a sixth capacitor, one terminal of the sixth capacitor being electrically coupled to the another one of the two input terminals of the amplifier, and another terminal of the sixth capacitor being electrically coupled to another one of the two output terminals of the amplifier.

12. The analog to digital converter of claim 11, wherein the bit conversion module further comprises:
a comparator, two input terminals of the comparator being electrically coupled the two output terminals of the amplifier respectively, an output terminal of the comparator being configured to generate the quantization output;
a first voltage reference circuit, comprising:
a first input terminal configured to receive an external reference voltage;
a second input terminal configured to receive the quantization output; and an output terminal configured for generating the first reference voltage; and a second voltage reference circuit, comprising:
a first input terminal configured to receive the external reference voltage;
a second input terminal configured to receive the quantization output; and
an output terminal configured to generate the second reference voltage.

13. The analog to digital converter of claim 12, wherein each of the first voltage reference circuit and the second voltage reference circuit is a digital to analog converter.

14. The analog to digital converter of claim 9, further comprising:
a combinational logic circuit configured to generate a digital code based on the quantization output.

15. The analog to digital converter of claim 10, further comprising:
a combinational logic circuit configured to generate a digital code based on the quantization output.

16. The analog to digital converter of claim 11, further comprising:
a combinational logic circuit configured to generate a digital code based on the quantization output.

17. The analog to digital converter of claim 12, further comprising:
a combinational logic circuit configured to generate a digital code based on the quantization output.

18. The analog to digital converter of claim 13, further comprising:
a combinational logic circuit configured to generate a digital code based on the quantization output.

\* \* \* \* \*